(12) United States Patent
Niemann et al.

(10) Patent No.: US 9,124,104 B2
(45) Date of Patent: Sep. 1, 2015

(54) ELECTRICAL CONNECTING DEVICE FOR HYBRID AND ELECTRIC VEHICLES AND ASSOCIATED METHOD FOR CHARGING

(75) Inventors: Holger Niemann, Shanghai (CN);
Volkmar Wuensch, Untergruppenbach (DE); Ines Wuensch, legal representative, Untergruppenbach (DE); Sebastian Wuensch, legal representative, Kraussnitz (DE); Franziska Wuensch, legal representative, Berlin (DE)

(73) Assignee: ROBERT BOSCH GMBH, Stuttgart (DE)

( * ) Notice: Subject to any disclaimer, the term of this patent is extended or adjusted under 35 U.S.C. 154(b) by 379 days.

(21) Appl. No.: 13/620,292

(22) Filed: Sep. 14, 2012

(65) Prior Publication Data

US 2013/0069590 A1   Mar. 21, 2013

Related U.S. Application Data

(63) Continuation of application No. 13/377,782, filed as application No. PCT/EP2010/065134 on Oct. 8, 2010, now abandoned.

(51) Int. Cl.
*G01N 27/416* (2006.01)
*H02J 7/00* (2006.01)
(Continued)

(52) U.S. Cl.
CPC ........... *H02J 7/0042* (2013.01); *G01R 31/3648* (2013.01); *G01R 31/006* (2013.01); *G01R 31/361* (2013.01)

(58) Field of Classification Search
CPC ............. G01R 31/3648; G01R 31/361; G01R 31/3606; G01R 31/006; G01R 31/3651; Y02T 90/14; Y02T 90/128; Y02T 90/163; Y02T 10/7005; Y02T 10/7088
USPC .................... 324/119, 120, 426–428; 320/48, 320/107–109, 150; 701/22; 307/9, 1; 180/65.8
See application file for complete search history.

(56) References Cited

U.S. PATENT DOCUMENTS 5,614,808 A * 3/1997 Konoya et al. ................ 320/109
5,931,245 A * 8/1999 Uetake et al. ................ 180/65.8
6,281,663 B1 * 8/2001 Yagi et al. ..................... 320/150
(Continued)

FOREIGN PATENT DOCUMENTS

CN        201117761      9/2008
CN        101420132      4/2009
(Continued)

*Primary Examiner* — Patrick Assouad
*Assistant Examiner* — Sean Curtis
(74) *Attorney, Agent, or Firm* — Kenyon & Kenyon LLP

(57) ABSTRACT

An electrical connecting device having an output connection, which is designed to be detachably connected to a charging connection of an accumulator device of a vehicle operated using current, the electrical connecting device also including a supply connection that is designed to be detachably connected to a network connection of an alternating current low-voltage interconnected network. The connecting device is characterized in that the electrical connecting device includes an alternating current/direct current converter, which is suitable for converting the alternating voltage of the supply connection to an electric DC voltage suitable for the accumulator device. A method is also described for charging an accumulator device of a vehicle operated by current using an electrical connecting device.

10 Claims, 1 Drawing Sheet

(51) Int. Cl.
*G01R 31/00* (2006.01)
*G01R 31/36* (2006.01)

(56) References Cited

U.S. PATENT DOCUMENTS

| | | | |
|---|---|---|---|
| 6,724,100 B1* | 4/2004 | Gabriel | 307/9.1 |
| 7,728,456 B2* | 6/2010 | Kusubayashi | 307/9.1 |
| 7,950,943 B2* | 5/2011 | Ohtomo | 439/299 |
| 8,143,843 B2* | 3/2012 | Ichikawa | 320/104 |
| 8,258,744 B2* | 9/2012 | Ishii et al. | 320/104 |
| 8,319,358 B2* | 11/2012 | Curry et al. | 290/1 A |
| 8,368,350 B2* | 2/2013 | Iwanaga et al. | 320/109 |
| 8,368,352 B2* | 2/2013 | Ichikawa et al. | 320/109 |
| 8,442,727 B2* | 5/2013 | Yamamoto et al. | 701/49 |
| 8,751,081 B2* | 6/2014 | Kato et al. | 701/22 |
| 8,907,622 B2* | 12/2014 | Itagaki et al. | 320/109 |
| 2006/0016793 A1* | 1/2006 | Zhu et al. | 219/205 |
| 2009/0033253 A1* | 2/2009 | Nagashima et al. | 318/139 |
| 2009/0082916 A1* | 3/2009 | Tanaka | 701/22 |
| 2010/0045232 A1* | 2/2010 | Chen et al. | 320/109 |
| 2010/0079105 A1* | 4/2010 | Iwanaga et al. | 320/109 |
| 2010/0090851 A1* | 4/2010 | Hauser | 340/657 |
| 2012/0065828 A1* | 3/2012 | Kato | 701/22 |
| 2012/0072066 A1* | 3/2012 | Kato et al. | 701/22 |

FOREIGN PATENT DOCUMENTS

| | | |
|---|---|---|
| JP | 5-276674 | 10/1993 |
| JP | 8-33121 | 2/1996 |
| JP | 2002-374675 | 12/2002 |
| JP | 2003-219511 | 7/2003 |
| JP | 2004-32869 | 1/2004 |
| JP | 2004-79320 | 3/2004 |
| JP | 2007-228716 | 9/2007 |
| JP | 2009-171700 | 7/2009 |
| JP | 2009-232644 | 10/2009 |

* cited by examiner

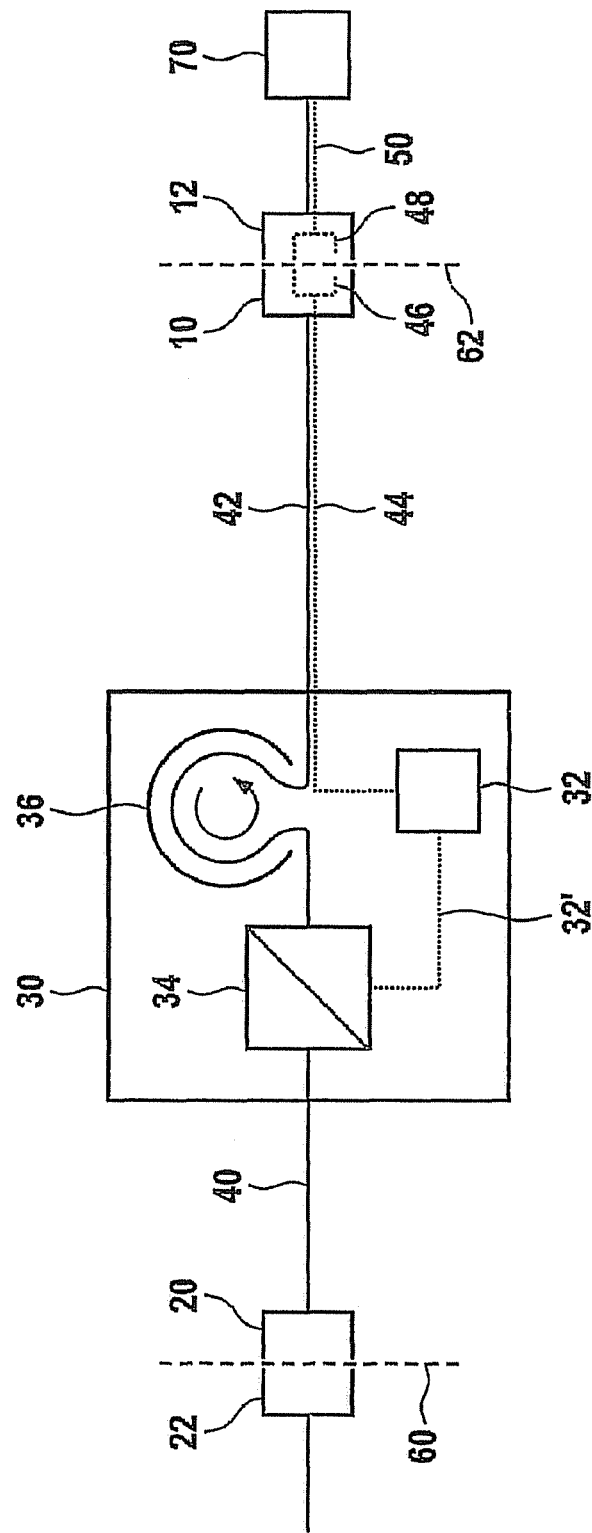

ELECTRICAL CONNECTING DEVICE FOR HYBRID AND ELECTRIC VEHICLES AND ASSOCIATED METHOD FOR CHARGING

CROSS-REFERENCE TO RELATED APPLICATIONS

This application is a continuation of U.S. patent application Ser. No. 13/377,782 filed on Dec. 12, 2011 now abandoned which was filed as a PCT application PCT/EP2010/065134 on Oct. 8, 2010, which claims foreign priority benefits under 35 U.S.C. §119 to German Patent Application No. 10 2009 045 639.2, filed on Oct. 13, 2009, all of which are hereby incorporated by reference in their entirety.

FIELD OF THE INVENTION

The present invention relates to a connecting device and a method for charging hybrid and electric vehicles, particularly for charging using the electric power of a supply network.

BACKGROUND INFORMATION

Conventionally, one may charge hybrid and electrical vehicles by a connecting cable using a supply network. Electrical supply networks supply an alternating voltage of 230 V (or other standardized voltage values, such as 110 V), which, however, on the one hand, based on the high value of the voltage, and on the other hand, based on its type, that is, alternating voltage, is not directly suitable for charging accumulators of electrically operated vehicles. Accumulator devices for the traction of electrically operated vehicles require DC voltage, the charging current being defined by the level of the DC voltage.

For charging accumulator devices, using an alternating voltage supply network, it is therefore necessary to provide an alternating current/direct current converter which rectifies, for one thing, and supplies a direct voltage having an adjustable and suitable level for another. The direct voltage may also be fixed ahead of time, as a function of the charging mechanism, in which case, however, in usual supply networks of 230 V or 110 V, no suitable voltage level is able to be achieved by mere rectification.

Therefore, alternating current/direct current converters are required which are conventionally provided particularly at the accumulator device, generally within the vehicle.

Consequently, in conventional charging processes, the connection between an alternating current interconnected network and a vehicle is a simple cable, via which, for charging the accumulators, the vehicle is connected to an alternating voltage supply network. On the one hand, the conversion as well as the adjustment to the suitable voltage level is provided within the vehicle, so that, for different supply networks, there is compatibility, especially when vehicles are exported to countries having different supply voltages. On the other hand, alternating current/direct current converters have to be designed specifically for the accumulator device and specifically for the voltage, which an interconnected network, i.e., the electrical supply, provides in an area in which the vehicle is being operated.

SUMMARY

It is an object of the present invention to provide a simplifying electrical connecting device and a simplifying method for charging an accumulator device.

In accordance with an example embodiment of the present invention, the alternating current/direct current converter is not provided at the accumulator device and in the vehicle in which the accumulator device is located, but instead to provide the required conversion, and thus also the converter itself, outside the vehicle, i.e., within an electrical connecting device which is designed to connect a fixed network terminal of a low voltage interconnected network and the charging terminal of the vehicle.

An example electrical connecting device according to the present invention includes a supply terminal by which the connecting device is able to be connected to the network terminal. In the same way, the electrical connecting device according to the present invention includes an output terminal which is able to be connected to the charging terminal. Both the network connection and the charging connection of the vehicle are not a part of the electrical connecting device, but represent complementary connecting elements for the supply connection and for the output connection. Consequently, during charging, the supply connection is connected to the network connection using a (lockable and detachable) plug connection to the network connection, for instance, via a usual network plug, and the output connection is connected via a (lockable and detachable) plug connection to the charging connection of the vehicle, these connections to the vehicle and the interconnected network being detachable. The alternating current/direct current converter is provided between the supply connection and the output connection of the connecting device, so that the input of the converter is connected to the supply connection, and the output of the converter is connected to the output connection. Furthermore, the electrical connecting device includes at least one cable, the at least one cable being able to be provided between the supply connection and the converter; the at least one cable being able to include an additional cable which connects the converter to the output connection. The electrical connecting device may further include a cable drum, for winding up the cable, on which the at least one cable (preferably all the cable pieces of the at least one cable) may be wound up. In this cable drum, or fastened to it, there is an alternating current/direct current converter, in order to be able to adjust the DC voltage output by it or to provide it according to a desired charging mode. In the same way, the converter is preferably designed to work with different alternating voltages and/or different frequencies, without the output voltage thereby changing (with the configuration remaining the same). In particular, the converter is preferably designed to be connected to a 110-Volt network and to a 230-Volt network having alternating voltage at a frequency of 50 or 60 Hz, and from this to generate an adjustable output DC voltage, which is output at the output connection.

The connecting device according to the present invention may thus be provided in a simple manner to have an additional safety mechanism, which first detects whether the output connection is still plugged into the charging connection or whether at least a part of the cable is still located outside the cable drum, in order to conclude from this that the vehicle is connected at least mechanically to the connecting device. If it is thus detected that the connecting device has not yet been detached from the vehicle, then, via a data interface or a control interface, the electrical connecting device is able to prevent the vehicle from going over into driving mode. This may be provided, for instance, by a command of the electrical connecting device, which is transmitted to the vehicle via the still-existing connection between the output connection and the charging connection, a driving operation control of the vehicle thereby receiving the information that the driving mode is to be blocked.

Moreover, a data exchange may be provided by the connecting device, in which the charging connection, or rather, the vehicle itself, via its control, transmits data to the electrical connecting device and to the converter, in order to charge the converter according to the charging voltage requested by the vehicle. In the same way, the vehicle control or a charging control may transmit a command via the charging connection and the output connection, and consequently via the data interface provided thereby, namely, a parameter or a control command to the converter, which gives a desired charging mode. Such a charging mode may describe, for instance, a charging or a compensation charging, the converter being set according to this command, so as to output a corresponding current and/or a corresponding voltage to the output connection. The electrical connecting device thereby becomes universally applicable, since it is not a fixed entity for one specific accumulator type, but is freely configurable by the respective vehicle. This permits the use of the electrical connecting device for a multitude of vehicle models.

In the same way, one and the same electrical connecting device is suitable for a plurality of charging modes, to the extent that the latter are able to be transmitted to the connecting device via the data connection. In one particularly simple embodiment, a voltage value is output to the connecting device via a normalized data transmission protocol, which applies as a setpoint value for the converter. In particular, by repeated transmission of such voltage values, any voltage profile or any charging mode may be set by the control of the vehicle, the converter of the connecting device according to the present invention thereby being able to output any desired voltage via the output connection to the accumulator of the vehicle. In this case, only a normalized data interface is required, which is preferably cable-bound (such as in the manner of an USB connection) or may be provided as a connection via a radio interface, or using near field induction, or via an infrared interface. Preferably, however, a cable-supported data interface is used, which provides a plug connection that is provided mechanically within the output connection (or, in complementary fashion, within the charging connection, in parallel to a power connection, via which the charging voltage or the charging current is transmitted to the vehicle at the output connection. The data interface or its bodily manifestation (for instance, as a plug connection) within the output connection is preferably fixedly connected to connecting components of the output connection, via which a charging current is transmitted from the converter to the vehicle via the output connection, if the connecting device is connected to the vehicle.

The electrical connecting device according to the present invention therefore includes an output connection that is designed to be detachably connected to a charging connection of an accumulator device of a vehicle operated by current. The electrical connecting device also includes a supply connection that is designed to be detachably connected to a network connection of an alternating current low-voltage interconnected network. The output connection of the electrical connecting device and the charging connection of a vehicle that is to be connected to it are thus complementary connecting elements. In the same way, the supply connection of the electrical connecting device and the network connection of the alternating current low-voltage interconnected network are complementary to each other. The network connection of an alternating current low-voltage interconnected network is usually supplied by a usual alternating current supply connection of a 230 Volt or 110 Volt current connection to which the supply connection is complementary. The network connection has the form of a usual 230 Volt alternating current/direct current converter socket outlet, for instance, and the supply connection is therefore developed like a usual mains plug. The output connection preferably differs from the supply connection, so as to avoid interchanges.

The electrical connecting device according to the present invention includes an alternating current/direct current converter, that is also designated as an AC/DC converter. The converter preferably has a nominal power at which the desired charging currents may be implemented, for instance, a nominal power of at least 0.5 kW, 1 kW, 2 kW, or 5 kW or 10 kW. The input of the alternating current/direct current converter is preferably designed to be two-phase, but may also be provided for a three-phase connection. In the case of a three-phase connection, the supply connection of the connecting device according to the present invention is designed as a three-phase connection and is embodied to be connectible with a usual three-phase socket. The converter of the connecting device according to the example embodiment of the present invention is designed to convert alternating voltage of the supply connection to an electric DC voltage that is suitable for an accumulator device. For this, the converter is configurable and adjustable, so that the output voltage may be selected.

The output connection preferably has a two-pole plug connection element by which the connecting device is able to be connected to the charging connection of a vehicle. For this, a plurality of cables having sufficient cross section are suitable, which make possible a current transmission of at least 5 A, 10 A, 20 A or 50 A. The output connection is therefore suitable for being connected to a charging connection of an accumulator device of a vehicle, the vehicle being able to be an hybrid or an electric passenger motor vehicle, and the accumulator device being suitable in its capacity and power for use as a traction energy store within an hybrid or an electric passenger motor vehicle. In particular, the output connection is designed to be connected to a charging connection of the accumulator device, which is used as a traction energy store for an hybrid or an electric passenger motor vehicle, and thus has an high capacity, especially higher than the capacities of accumulators of an internal combustion engine-driven motor vehicle.

According to one preferred specific embodiment of the present invention, the converter is designed to output a DC voltage of adjustable level. The adjustable level may be provided by a memory within the electrical connecting device, or may be transmitted via an input of the electrical connecting device. Consequently, the alternating current/direct current converter includes a memory in which a value is stored that defines the level of the voltage as a setpoint value. Alternatively or in combination with this, the alternating current/direct current converter (or the connecting device) may have an input at which the level of the voltage may be input as setpoint value for the converter. Alternatively or in combination with this, the converter or the connecting device may include a switch, whose setting defines the level of the voltage as a setpoint value. Alternatively or in combination with this, the connecting device or the converter may include a potentiometer, whose setting defines the level of the voltage as a setpoint value. One is thereby able to set the voltage as output voltage of the converter, as a function of the vehicle that is to be connected.

In a further preferred specific embodiment, the electrical connecting device also includes a cable drum or another device for accommodating the at least one cable of the electrical connecting device. Thus, the connecting device also includes at least one cable, for connecting the converter to the supply connection, to the output connection or to both. The cable drum offers sufficient inner space for accommodating the cable, and preferably also includes a roll-up mechanism, for drawing the cable generally completely into the cable drum. By "drawing the cable generally completely into the cable drum" one should understand that the cable drum, or rather its inner space, encloses the connecting cable for the most part, and only short cable pieces (if present) and perhaps the supply connection and the output connection are provided completely or partially outside the cable drum, and the at least one cable is generally accommodated completely in the cable drum. Thus, by "complete accommodation" a condition is also understood in which the supply connection or the output connection project completely or partially from the cable drum. The same applies for short sections of the cable, which is directly connected to the supply connection or the output connection. The at least one cable connects the output connection to the supply connection via the converter. In this instance, the at least one cable may include two sub-pieces, which are provided between the converter and the output connection or between the converter and the supply connection. Furthermore, however, only one single cable may be provided which connects the converter to the supply connection, or which connects the converter to the output connection, an additional external cable being required for the connection to the network connection or to the charging connection.

According to one further preferred specific embodiment, the electrical connecting device is provided with a safety mechanism, which prevents a vehicle that is connected to this from a driveaway of the vehicle. Such a connecting device also includes a sensor, that is provided in the output connection or at the alternating current/direct current converter. The sensor is designed to ascertain, electronically or mechanically, whether the output connection is plugged into a charging connection connected to it. Thus, the sensor is in a position of detecting the connection state between the output connection and the charging connection, so that the sensor is able to provide data that are able to be used for the safety mechanism. Alternatively or in combination with this, the sensor is designed to ascertain whether the electrical connecting device is in a generally completely rolled-up state. The sensor is therefore in a position to detect whether the at least one cable is completely accommodated on the cable drum. If this is the case, one may assume that no connection exists between charging connection and output connection. This specific embodiment relates particularly to a connecting device according to the present invention, in which a piece of cable of at least one cable is provided between the converter and the output connection. Using a switch, the sensor is able to detect, for example, the plugged-in state, or it is able to detect whether the cable drum is extensively rolled up. As an alternative, optical detection mechanisms, or the like, may be used. According to a further specific embodiment, the sensor is provided by at least one electrical contact that is provided at the output connection, and which is connected by a connecting element in the charging connection, if the output connection is provided in the charging connection, and which is not connected if the output connection is located outside the charging connection.

These sensor data are preferably passed on to a controller, in order to stop a vehicle (that is, to block an active travel condition) based on the sensor data, and to release a vehicle to travel when it is ascertained that the output connection is not connected to the charging connection. Therefore, the connecting device according to the present invention, preferably its output connection, has a data interface which is able to be connected to a data interface of a charging connection of a vehicle. The data interface of the output connection is designed to output control data and sensor data to the data interface of the charging connection that is complementary to it. The sensor data describe a plugged-in state of the output connection or other state data of the connecting device. In particular, the sensor data describe whether the output connection is still connected to the charging connection or not. Based on the sensor data, the connecting device according to the present invention, preferably the converter, generates control data, in order to output these via the data interface of the output connection to the vehicle, or rather to a vehicle controller. The control data therefore include a driving operation control command which induces the vehicle controller to ignore a starting instruction and/or to suppress all possible transitions to a travel state of the vehicle. The control data, especially the driving operation command, are generated by the electrical connecting device, which is arranged to do this, sensor data being also generated by the electrical connecting device and output connection via the output connection. Furthermore, the data interface of the output connection is designed to transmit data in the opposite direction. Control data that are transmitted by the connecting device to the vehicle via the output connection especially include the driving operation control command. Control data that are transmitted in the opposite direction, that is, towards the connecting device (and starting from the vehicle), include a charging command or a compensation charging command. According to this command, the converter is either induced to output a charging current or to output a compensation charging current. Alternatively, instead of the command, control data may also be transmitted which specify a voltage setpoint value or a current setpoint value, according to which the converter is operated. Moreover, sensor data that are transmitted from the output connection to the connecting device, are able to describe a setpoint charging response or other charging parameters, especially operating state data of the vehicle, from which the converter may draw a conclusion on a suitable mode.

According to that, the output connection of the connecting device, according to the example embodiment of the present invention, is outfitted with a current transmission element, for instance, in the form of power current plugs, as well as with a preferably cable-bound plug connection, which provides the data interface of the output connection. The data interface is preferably a serial data interface according to a normalized protocol. That means that vehicles only have to master the data transmission protocol in order to be charged by the connecting device according to the present invention, when prompted by specifications internal to the vehicle.

In a further specific embodiment, the data interface is provided as a radio connection, the converter having an appropriate send/receive device, together with a control which controls components provided for current conversion according to data received using the radio interface.

The present invention is further provided by an example method for charging an accumulator device of a vehicle operated using current. The example method is preferably based on using the electrical connecting device, so that at least charging using the electrical connecting device described above is provided. The example method includes converting an alternating current of an alternating current low-voltage interconnected network into DC voltages, which is suitable for charging an accumulator device. Alternatively, the alternating voltage may be converted to a DC voltage (by the converter of the connecting device), which is suitable for the compensation charging of the accumulator device, i.e., for providing a DC voltage from which, together with the accumulator, a charging current results which, generally, corresponds to the self-discharge and the standby current use of the vehicle. The DC voltage of the converter is supplied to a charging connection of the vehicle, via the output connection of the electrical connecting device, according to the present invention. However, the converter is not located within the vehicle, as is the conventional case, but outside the vehicle in the electrical connecting device, which provides the connection between the vehicle and the network connection. The electrical connecting device, in particular the alternating current/direct current converter, is therefore provided outside the vehicle, during charging. Because the converter is provided outside the vehicle, it is in a position to detect the state of connection between the output connection and the charging connection, and to react accordingly (for instance, by activating a vehicle controller to block a driving mode) and it is also in a position of being able to be used for different vehicles. In particular, the connecting device provides a detachable interface by which the converter is able to be separated from the accumulator, so that one is able to use the converter for other vehicles, and so that the converter is provided outside the vehicle, for this purpose. The example method therefore includes particularly the connecting of the connecting device to the vehicle via a separable connection. This is provided, as was described above, by an output connection of the connecting device and a charging connection of the vehicle, which are complementary to each other, and provide a detachable plug connection.

An example method according to the present invention preferably also includes the safety mechanism described above, which is based on the idea that the example connecting device according to the present invention detects whether the output connection is still connected to the charging connection or not, and accordingly prevents the vehicle from starting or traveling, by generating appropriate control signals and/or control commands. Alternatively to detecting the plug-connected state between output connection and charging connection (which are complementary to each other) the unrolled state of the electrical connecting device may also be detected. The unrolled state denotes the position of the at least one cable with respect to the inner space of the cable drum, it being assumed that the cable and the output connection are generally located completely inside the cable drum if the output connection and a majority of the cable are provided inside the cable drum. In this case, it is assumed that the connecting device according to the present invention has not been rolled out, but the output connection is present separately from the charging connection, so that a starting process or driving operation of the vehicle is not prevented. According to that, the travel operation of the vehicle is blocked if it is ascertained by the detection step that the electrical connecting device is connected to a charging connection of the vehicle, that is, that the output connection is connected to the charging connection. Alternatively, it is ascertained by the detection step that the electrical connecting device is not in a generally completely rolled up state, whereby the travel operation is also blocked.

According to one additional specific embodiment of the method according to the present invention, the electrical connecting device according to the present invention is an active component of the blocking mechanism, and generates and transmits a blocking command to the vehicle, or to a driving control of the vehicle. The blocking command is thus not only transmitted by the electrical connecting device, but also generated by it, preferably by a control of the converter.

In this instance, the blocking command is transmitted via a data interface, which is provided by the electrical connecting device. The data interface is particularly formed by the data interfaces of the output connection and the charging connection that are complementary to each other. The output connection and its data interface are preferably mechanically connected to each other, whereby during the removal and during plugging in the output connection by the mechanical connection between this output connection and its data interface, the latter is separated from the data interface of the charging connection or is connected to it. The removal and the plugging in of the output connection from/to the charging connection, and the connection for the electrical energy transfer to the connection to the data transmission (i.e., using the data interface) are synchronized via the mechanical connection, so that both are simultaneously removed or plugged in.

Furthermore, not only is the mechanical connection between the output connection and the charging connection able to be detected by electrical or mechanical sensors, but the connection between the output connection and the charging connection may also be monitored electrically by having the connecting device, and particularly the converter, check an electrical connection by recording a current flow and sensing a contact accordingly. In response to a missing contact between the output connection and the charging connection, no current is able to flow through the connecting device, from which it may be concluded, just on the basis of the current flow in the at least one cable, in the converter or even at the supply connection or at the output connection, that no contact exists between the output connection and the charging connection. A current flow of generally zero therefore leads to the lifting of the travel blocking, whereas a current flow of greater than zero is evaluated as a connection between the output connection and the charging connection, and consequently the travel operation is blocked, preferably using control commands via the data interfaces of the output connection and the charging connection. Instead of an active transmission of control data by the electrical connecting device, the electrical connecting device, according to a polling method, may also give out control data/sensor data upon a retrieval request by a vehicle control.

BRIEF DESCRIPTION OF THE DRAWING

FIG. 1 shows an embodiment of the electrical connecting device according to the present invention, in a basic representation.

DETAILED DESCRIPTION OF EXAMPLE EMBODIMENTS

FIG. 1 shows in a schematic representation a specific embodiment of the electrical connecting device according to the present invention, having an output connection 10 and a supply connection 20. The electrical connecting device also includes an alternating current/direct current converter 30, which is furnished with a converter control 32 and a power converter 34 for converting an alternating current to a direct current. Converter 30 therefore does not only include current converter component 34 in the form of the converter itself, but also converter control 32. Converter 30 of the connecting device according to the present invention also includes a cable drum 36, so as to be able to take up at least one cable section. In FIG. 1 the converter is shown only symbolically, the functions of controlling, converting and the storing of cable sections being shown symbolically under reference numerals 32, 34 and 36, and converter 30 unifies these functions in the form of the rectangle that circumscribes, the illustrations of the functions of converter 30. In the real implementation, on the other hand, the converter may be defined bodily generally by the cable drum in which the cable, control 32 and converter 34 are accommodated.

According to the present invention, output connection 10 is designed to be connected to a charging connection 12 of a vehicle (not shown). Output connection 10 and charging connection 12 are consequently complementary plug connection elements.

In the same way, supply connection 20 is provided to be connected to a network connection 22, so that supply connection 20 is developed to be complementary to network connection 22. Network connection 22 is connected to an alternating current low-voltage interconnected network (not shown). The electrical connecting device according to the present invention, according to FIG. 1, further includes two cables 40, 42, cable 40 or cable section 40 being provided between alternating current/direct current converter 30 and supply connection 20, so as to connect these two to each other. In the same way, cable 42 or cable section 42 is provided between converter 30 and output connection 10, and provides an electrical connection between these components. The electrical connection for the transmission of charging energy from network connection 22 to charging connection 12, provided by the cables, is shown by a solid line.

Over and above that, the connecting device according to the present invention includes control connections and data connections which are shown by dotted lines. For one thing, converter control 32 is connected to converter 34 via such a control connection, to activate it with respect to setpoint value specifications. In addition, cable 42, besides a connection for the transmission of electrical charging energy, also provides a data connection, which is shown as a dotted line. This data connection 44 extends between converter 30 and output connection 10. Output connection 10 also includes devices for data transmission 46, which form a data interface for output connection 10. The contacts which implement this interface 46 are preferably connected in a fixed manner to the contacts which provide the power-transmitting part of output connection 10. Data interface 46 of the output connection is developed in a complementary fashion to data interface 48, which is associated with the charging connection. Because of that, a data connection is provided between data interface 48 of charging connection 12, of data interface 46, complementary to it, of output connection 10 and of data connection 44, which runs between the converter and the output connection. According to a first specific embodiment, data connection 44 is embodied as a physical channel which is separate from cable 42. Alternatively, data connection 44 may be logically separated from power connection 42, but developed physically by the same entity. In this case, for instance, cable 42 is provided for transmitting charging power, and data connection 44 is provided by a signal that is modulated upon the cable, which is logically separated at output connection 10 (for example, by filtering) from power transmission 42. In this case, control 42 provides such a modulation and/or filtering for transmitting and receiving. Furthermore, data connection 44 may be designed to be in the other direction, in which case interface 48 of charging connection (or a controller of the vehicle) modulates a signal upon the existing cable and output connection 10, in order to separate the modulated-upon signal by controller 32 logically from cable connection 42.

Independently of the actual implementation, the embodiment of FIG. 1 shows a cable connection 44, via which, for instance, control date of the vehicle (not shown) are transmitted via the data interfaces of the charging connection and of output connection 46, 48, via data connection 44 to converter 30. The controller records the signals and accordingly activates converter 34 via control connection 32'. In the same transmission direction, a sensor may be provided through interfaces 46, 48, using which one is able to detect whether the output connection is plugged into the charging connection or not. For this, an additional sensor (not shown) may be provided within output connection 10 or on it, which detects the plugged-in state. The sensor signal corresponding to the plugged-in signal is transmitted to converter 30 by data line 44, whose controller 32 records this signal and derives from it whether output connection 10 is still connected to charging connection 12 or not. (Alternatively, the current flow through cable 42 may be recorded, for instance, by converter 34 or by controller 32, in order to conclude from the current flow whether output connection 10 is still connected to charging connection 12). If it is detected (independently of the detection method) that output connection 10 is connected to charging connection 12 (or its data interfaces 46, 48 are connected to each other), controller 32 of converter 30 generates a control signal which is transmitted via data connection 44 by converter 30 to data interface 46 of output connection 10, from there to data interface 48 of the charging connection, and starting from this data interface 48, further to a controller (not shown) via a data line 50 that is internal to the vehicle. Via this path, converter 30 according to the present invention transmits a blocking command, which prevents the vehicle (not shown) from going over to a travel state.

As was noted before, the connecting device according to the present invention is neither a component of a vehicle nor a part of a network connection or of an alternating current low-voltage interconnected network. Rather, output connection 10 and supply connection 20 provides a connecting element in each case, which is complementary to the network connection or the charging connection. The corresponding interfaces are shown by dashed lines 60, 62, interface 60 being used for the energy transmission between network connection 22 and supply connection 20, but which separates the connecting device from the network connection and the interconnected network, and interface 62 being used for power transmission (and also data transmission) between output connection 10 and charging connection 12 (or its interfaces 46, 48). Both interface 60 and interface 62 are provided by detachable electrical connections, so that the electrical connecting device is basically separable from the vehicle and separable from the network connection.

What is claimed is:

1. An electrical connecting device, comprising:
   an output connection which is configured to be detachably connected to a charging connection of an accumulator device of a vehicle operated using current; and
   a supply connection that is configured to be detachably connected to a network connection of an alternating current low-voltage interconnected network; wherein the electrical connecting device includes an alternating current/direct current converter system, which is configured to convert alternating voltage of the supply connection to an electric DC voltage suitable for the accumulator device;
   wherein the alternating current/direct current converter system is configured to output a DC voltage of an adjustable level;
   wherein the output connection further has a data interface, which is configured for connection to a data interface of a charging connection that is connectable to the output connection, the alternating current/direct current converter system including a controller that receives at least one of sensor data and control data from the data interface of the charging connection via the data interface of the output connection, the sensor data describing at least one of a charging state of the accumulator device and other operating state data of the vehicle of the accumulator device, and the control data describing at least one of a setpoint charging voltage, a setpoint charging behavior and other charging parameters, which are provided for implementation by the alternating current/direct current converter system.

2. The electrical connecting device as recited in claim 1, wherein the output connection is configured to be connected to the charging connection of the accumulator device of one of a hybrid or an electric passenger motor vehicle.

3. The electrical connecting device as recited in claim 1, wherein the alternating current/direct current converter system includes at least one of the following: a memory in which a value is stored which defines a level of the DC voltage as a setpoint value, an input into which the level of the DC voltage is able to be entered as a setpoint value for the alternating current/direct current converter system, a switch whose setting defines the level of the DC voltage as a setpoint value, and a potentiometer whose setting defines the level of the DC voltage as a setpoint value.

4. The electrical connecting device as recited in claim 1, further comprising:
at least one cable, and a cable drum which is designed for complete accommodation of the cable, wherein the alternating current/direct current converter system is accommodated completely in the cable drum, and the at least one cable connects the output connection to the supply connection via the alternating current/direct current converter system.

5. The electrical connecting device as recited in claim 1, further comprising:
a sensor configured to ascertain, whether the output connection is plugged into a charging connection connectible to it, and whether the electrical connecting device is in a completely rolled-up state.

6. The electrical connecting device as recited in claim 1, wherein the controller outputs one of sensor data or control data to the data interface of the charging connection via the data interface of the output connection, the sensor data describing a plugged-in state of the output connection or other state data of the electrical connecting device, and the control data describing one of a travel operation blocking command, a charge-beginning command, a compensation charging command, or other charging data or travel operation data.

7. A method for charging an accumulator device of a vehicle operated using current, using an electrical connecting device, the method comprising:
converting an alternating voltage of an alternating current low-voltage interconnected network to a DC voltage, which is suitable for charging or compensation charging an accumulator device using an alternating current/direct current converter system;
supplying the DC voltage to a charging connection of the vehicle via an output connection of the electrical connecting device, the electrical connecting device including the alternating current/direct current converter system and the electrical connecting device inclusive of the alternating current/direct current converter system being provided outside the vehicle during charging, and during the charging, the output connection is connected detachably to the charging connection;
detecting one of a plugged-in state or an unrolled state of the electrical connecting device;
and blocking a travel operation of the vehicle at least one of: i) if it is ascertained by the detecting that the electrical connecting device is connected to a charging connection of the vehicle, or ii) if it is ascertained by the detecting step that the electrical connecting device is in a not completely rolled-up state,
wherein the detecting is carried out by the electrical connecting device, and the blocking includes: generating and transmitting a blocking command to one of the vehicle or to a travel control of the vehicle, using the electrical connecting device.

8. The method as recited in claim 7, wherein the blocking command is transmitted via a data interface which is provided by the electrical connecting device, and which, during the detaching or during the plugging in of the output connection, is separated or connected to a data interface of the charging connection because of a mechanical connection between the data interface of the electrical connecting device and the output connection.

9. The electrical connecting device as recited in claim 1, wherein the controller receives the sensor data.

10. The electrical connecting device as recited in claim 1, wherein the controller receives the control data.

* * * * *